(12) United States Patent
Morita

(10) Patent No.: US 12,295,245 B2
(45) Date of Patent: May 6, 2025

(54) VAPOR-DEPOSITION MASK, METHOD FOR MANUFACTURING VAPOR-DEPOSITION MASK, AND METHOD FOR MANUFACTURING DISPLAY DEVICE

(71) Applicant: TOPPAN INC., Tokyo (JP)

(72) Inventor: Takayuki Morita, Tokyo (JP)

(73) Assignee: TOPPAN INC., Tokyo (JP)

( * ) Notice: Subject to any disclaimer, the term of this patent is extended or adjusted under 35 U.S.C. 154(b) by 495 days.

(21) Appl. No.: 17/706,541

(22) Filed: Mar. 28, 2022

(65) Prior Publication Data

US 2022/0223827 A1 Jul. 14, 2022

Related U.S. Application Data

(63) Continuation of application No. PCT/JP2020/037077, filed on Sep. 30, 2020.

(30) Foreign Application Priority Data

Oct. 4, 2019 (JP) .................................. 2019-183968

(51) Int. Cl.
*H10K 71/00* (2023.01)
*C23C 16/04* (2006.01)
*C23F 1/02* (2006.01)

(52) U.S. Cl.
CPC ........... *H10K 71/00* (2023.02); *C23C 16/042* (2013.01); *C23F 1/02* (2013.01)

(58) Field of Classification Search
None
See application file for complete search history.

(56) References Cited

U.S. PATENT DOCUMENTS

2016/0208392 A1 7/2016 Ikenaga et al.
2018/0195177 A1 7/2018 Ikenaga et al.
(Continued)

FOREIGN PATENT DOCUMENTS

CN 103668055 A 3/2014
JP 2015-055007 A 3/2015
(Continued)

OTHER PUBLICATIONS

International Search Report mailed Dec. 8, 2020 for International Application No. PCT/JP2020/037077, with translation, 7 pages.
(Continued)

*Primary Examiner* — Hsien Ming Lee
(74) *Attorney, Agent, or Firm* — Squire Patton Boggs (US) LLP

(57) ABSTRACT

A vapor deposition mask made of metal includes: a front surface configured to oppose a vapor deposition source; and mask holes each including a hole portion having a shape of an inverted frustum. The hole portion of each of the mask holes includes: a small opening including a polygonal edge as seen from a view opposing the front surface of the vapor deposition mask, the edge including corners and linear portions each located between adjacent ones of the corners; and a large opening located on the front surface, the large opening including an edge as seen from the view opposing the front surface of the vapor deposition mask, the edge being shaped such that the corners of the edge of the small opening project outward from the edge of the small opening. The large opening surrounds the small opening as seen from the view opposing the front surface.

10 Claims, 7 Drawing Sheets

(56) References Cited

U.S. PATENT DOCUMENTS

| | | |
|---|---|---|
| 2018/0277799 A1 | 9/2018 | Ikenaga et al. |
| 2018/0334740 A1 | 11/2018 | Ikenaga et al. |
| 2019/0169733 A1 | 6/2019 | Ikenaga et al. |
| 2019/0345597 A1* | 11/2019 | Uchida ............... H10K 71/166 |
| 2020/0017950 A1 | 1/2020 | Oka et al. |
| 2020/0017951 A1 | 1/2020 | Ikenaga et al. |
| 2020/0019056 A1 | 1/2020 | Ikenaga et al. |
| 2020/0149139 A1 | 5/2020 | Oka et al. |
| 2020/0235298 A1 | 7/2020 | Nishi |
| 2021/0157232 A1 | 5/2021 | Ikenaga et al. |

FOREIGN PATENT DOCUMENTS

| | | |
|---|---|---|
| KR | 2018-0027624 A | 3/2018 |
| WO | WO 2017/057621 A1 | 4/2017 |
| WO | WO 2019/074104 A1 | 4/2019 |
| WO | WO 2019/098168 A1 | 5/2019 |

OTHER PUBLICATIONS

Notification of Reason for Refusal mailed Jan. 13, 2022 in related Korean Patent Application No. 10-2021-7042820, with English-language translation, 8 pages.

Notice of Reasons for Revocation mailed Mar. 18, 2022 in related Japanese Patent Application No. 2021-504547, with English-language translation, 49 pages.

* cited by examiner

VAPOR-DEPOSITION MASK, METHOD FOR MANUFACTURING VAPOR-DEPOSITION MASK, AND METHOD FOR MANUFACTURING DISPLAY DEVICE

BACKGROUND

The present disclosure relates to a vapor deposition mask, a method for manufacturing a vapor deposition mask, and a method for manufacturing a display device.

Display elements included in an organic electroluminescent (EL) display are formed through vapor deposition using a vapor deposition mask. The vapor deposition mask includes mask holes extending through a front surface of the vapor deposition mask, a rear surface of the vapor deposition mask, and a section between the front surface and the rear surface. Each mask hole opens in the front surface and the rear surface. The front surface includes a large opening of each mask hole. The rear surface includes a small opening of each mask hole. When the vapor deposition mask is used to perform vapor deposition for a vapor deposition target, the front surface of the vapor deposition mask opposes a vapor deposition source, and the rear surface of the vapor deposition mask opposes the vapor deposition target (refer to, for example, Japanese Laid-Open Patent Publication No. 2015-55007).

Each mask hole of the vapor deposition mask has the shape of an inverted frustum in the cross-section along a plane that is orthogonal to the front surface of the vapor deposition mask. The small opening of each mask hole is shaped in conformance with a shape required for a display element. To form a polygonal (e.g., quadrilateral) display element, the small opening of each mask hole usually has a shape including corners in plan view opposing the front surface of the vapor deposition mask.

In a vapor deposition material that travels from the vapor deposition source to the vapor deposition mask, the traveling direction of the vapor deposition material and the front surface of the vapor deposition mask form a traveling angle of the vapor deposition material. The vapor deposition material traveling toward the vapor deposition mask includes vapor deposition materials with various traveling angles. Most of the vapor deposition materials entering the mask holes from the vicinity of the middle portion of the large opening reach the small opening from the large opening regardless of the traveling angles of the vapor deposition materials.

Some of the vapor deposition materials entering the mask holes from the vicinity of the edge of the large opening deposits on side surfaces defining the mask holes without reaching the small opening. In particular, many of the vapor deposition materials entering the mask holes from the vicinity of the corners in the edge of the large opening are prevented from reaching the small opening by the side surfaces that define the mask holes. This varies the thickness of a vapor deposition pattern formed by the passage of the vapor deposition material through the small opening. As a result, the luminance becomes uneven in the display element including the vapor deposition pattern.

Such a problem also occurs in a case where the mask hole has a shape other than the shape of an inverted frustum. In such a case, for example, the mask holes each include a large hole portion with the shape of an inverted frustum directed from the front surface toward the rear surface and a small hole portion with the shape of a frustum directed from the rear surface toward the front surface. In this case, the opening formed by connecting the large hole portion to the small hole portion functions as the above-described small opening.

SUMMARY

It is an objective of the present disclosure to provide a vapor deposition mask, a method for manufacturing a vapor deposition mask, and a method for manufacturing a display device capable of limiting variations in the thickness of a vapor deposition pattern.

A vapor deposition mask that solves the above-described problem is made of metal. The vapor deposition mask includes: a front surface configured to oppose a vapor deposition source; and mask holes each including a hole portion having a shape of an inverted frustum. The hole portion of each of the mask holes includes: a small opening including a polygonal edge as seen from a view opposing the front surface of the vapor deposition mask, the edge including corners and linear portions each located between adjacent ones of the corners; and a large opening located on the front surface, the large opening including an edge as seen from the view opposing the front surface of the vapor deposition mask, the edge being shaped such that the corners of the edge of the small opening project outward from the edge of the small opening. The large opening surrounds the small opening as seen from the view opposing the front surface.

A method for manufacturing a vapor deposition mask that solves the above-described problem includes: forming a resist mask on at least one of a front surface and a rear surface of a metal sheet; and forming mask holes in the metal sheet using the resist mask. The forming the mask holes forms the mask holes, each including a hole portion having a shape of an inverted frustum, in the metal sheet such that the hole portion of each of the mask holes includes: a small opening including a polygonal edge as seen from a view opposing a plane on which the metal sheet spreads, the edge including corners and linear portions each located between adjacent ones of the corners; and a large opening located on the front surface, the large opening including an edge as seen from the view opposing the front surface of the vapor deposition mask, the edge being shaped such that the corners of the edge of the small opening project outward from the edge of the small opening, and such that the large opening surrounds the small opening as seen from the view opposing the front surface.

A method for manufacturing a display device that solves the above-described problem includes: preparing a vapor deposition mask obtained through the method for manufacturing the vapor deposition mask; and forming a pattern through vapor deposition using the vapor deposition mask.

DESCRIPTION OF EXEMPLARY EMBODIMENTS

A vapor deposition mask, a method for manufacturing a vapor deposition mask, and a method for manufacturing a display device according to an embodiment will now be described with reference to FIGS. 1 to 10. In the following description, the vapor deposition mask, the method for manufacturing the vapor deposition mask, a mask device, and examples will be described in this order.

Vapor Deposition Mask

The vapor deposition mask will now be described with reference to FIGS. 1 to 5.

Figure 1:
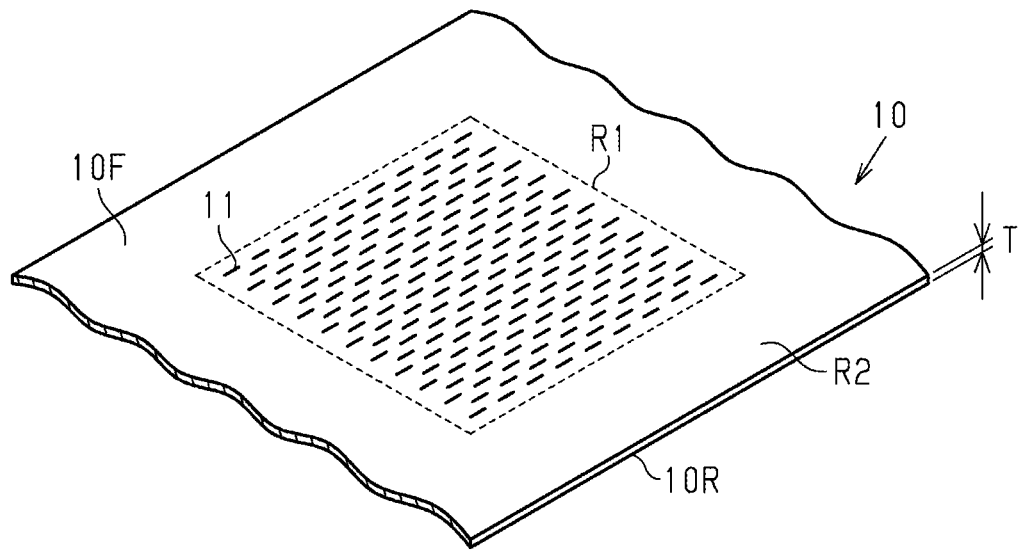
FIG. 1 is a perspective view showing the structure of a vapor deposition mask according to an embodiment.

FIG. 1 shows a pattern region and part of a surrounding region that are included in the vapor deposition mask.

FIG. 1 shows a vapor deposition mask 10 that is made of metal. The vapor deposition mask 10 includes a front surface 10F that opposes a vapor deposition source, and includes a rear surface 10R. The vapor deposition mask 10 includes mask holes 11 each including a hole portion having the shape of an inverted frustum. The vapor deposition mask 10 includes a pattern region R1 that includes the mask holes 11 and a surrounding region R2 that surrounds the pattern region R1 and does not include the mask holes 11.

In the present embodiment, the mask holes 11 are laid out in a staggered manner. The mask holes 11 may be laid out in an arrangement pattern other than a staggered pattern. The pattern other than a staggered pattern may be, for example, a square lattice.

The vapor deposition mask 10 has thickness T of, for example, between 1 μm and 20 μm inclusive. The thickness in the pattern region R1 may be smaller than the thickness in the surrounding region R2. In this case, the thickness of the vapor deposition mask 10 is the thickness in the surrounding region R2. The vapor deposition mask 10 is made of an iron-nickel alloy. The iron-nickel alloy may be, for example, an alloy containing 36 mass % of nickel (i.e., Invar). In other words, the vapor deposition mask 10 is substantially made of an iron-nickel alloy.

Figure 2:
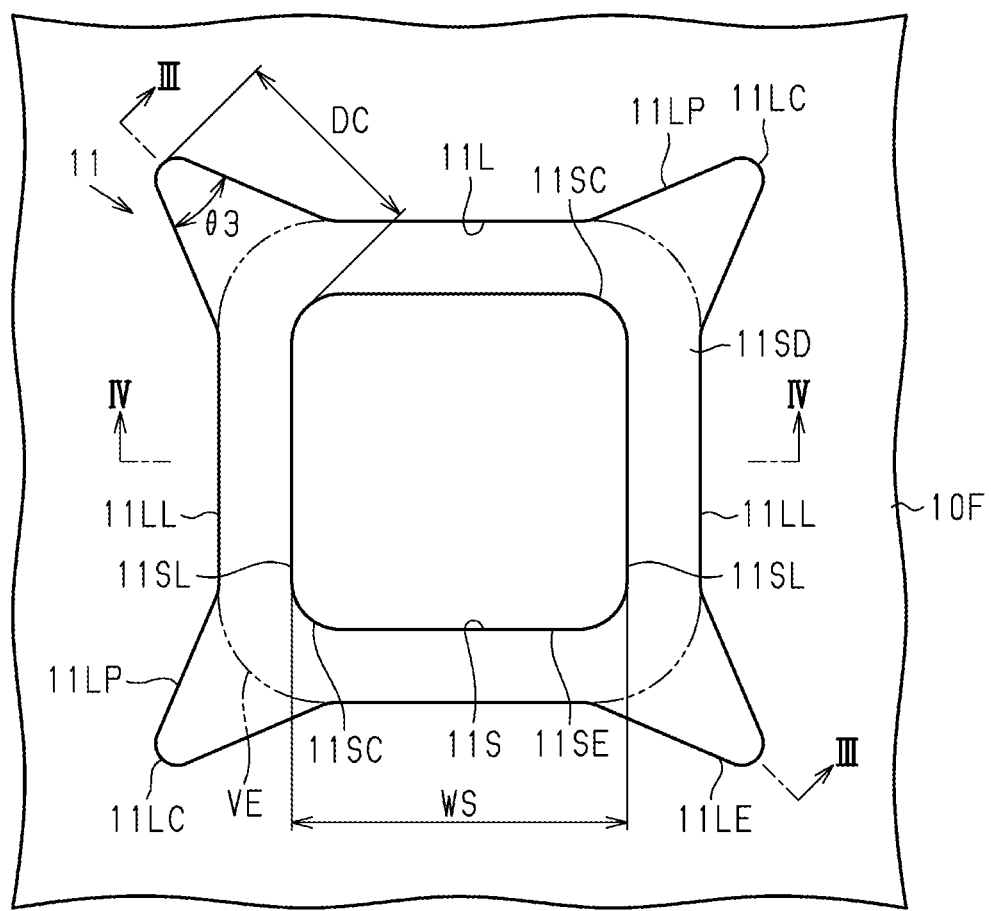
FIG. 2 is a plan view showing the shape of the mask hole seen from a view opposing the front surface of the vapor deposition mask.

FIG. 2 shows the shape of the mask hole 11 seen from a view opposing the front surface 10F of the vapor deposition mask 10.

As shown in FIG. 2, the mask hole 11 includes a small opening 11S and a large opening 11L. The small opening 11S is one opening in the hole portion. The large opening 11L surrounds the small opening 11S as seen from the view opposing the front surface 10F. In the present embodiment, the small opening 11S is located on the rear surface 10R of the vapor deposition mask 10. As seen from the view opposing the front surface 10F of the vapor deposition mask 10, the small opening 11S includes a polygonal edge 11SE. The edge 11SE includes corners 11SC and linear portions 11SL each located between adjacent ones of the corners 11SC.

In the present embodiment, the edge 11SE of the small opening 11S has a quadrilateral shape. The edge 11SE of the small opening 11S includes four linear portions 11SL and four corners 11SC. The four linear portions 11SL include two pairs of linear portions 11SL that are parallel to each other. The linear portions 11SL included in each pair extend in a direction that is orthogonal to the linear portions 11SL included in the corresponding pair. Each corner 11SC is a line segment located between the linear portions 11SL extending in directions that are orthogonal to each other, and has a predetermined curvature. In the small opening 11S, the distance between the linear portions 11SL parallel to each other is a small opening width WS.

The large opening 11L is the other opening in the hole portion. The large opening 11L includes an edge 11LE shaped such that the corners in the polygonal shape of the edge 11SE of the small opening 11S project outward from the polygonal shape. That is, the large opening 11L includes the edge 11LE shaped such that the corners 11SC of the edge 11LE of the small opening 11S project outward from the edge 11SE of the small opening 11S. The large opening 11L is located on the front surface 10F of the vapor deposition mask 10. As seen from the view opposing the front surface 10F of the vapor deposition mask 10, the large opening 11L includes the edge 11LE that is shaped to include corners 11LC. The number of the corners 11LC is the same as the number of the corners of the small opening 11S. As seen from the view opposing the front surface 10F, the maximum value of the distance between each corner 11SC at the edge 11SE of the small opening 11S and the corresponding corner 11LC at the edge 11LE of the large opening 11L is an inter-corner distance DC.

In the present embodiment, as seen from the view opposing the front surface 10F of the vapor deposition mask 10, the edge 11LE of the large opening 11L includes four linear portions 11LL and four corners 11LC. The four linear portions 11LL include two pairs of linear portions 11LL that are parallel to each other. The linear portions 11LL included in each pair extend in a direction that is orthogonal to the linear portions 11LL included in the corresponding pair. As seen from the view opposing the front surface 10F of the vapor deposition mask 10, the four linear portions 11LL are included in an imaginary edge VE. The shape of the imaginary edge VE is substantially similar to the shape of the small opening 11S.

The edge 11LE of the large opening 11L further includes four projections 11LP that project from the imaginary edge VE in a direction in which the projections 11LP are separated from the small opening 11S. Each projection 11LP is located between two of the linear portions 11LL that are orthogonal to each other. As seen from the view opposing the front surface 10F of the vapor deposition mask 10, the region defined by each projection 11LP is substantially triangular. Each corner 11LC belongs to a different one of the projections 11LP. As seen from the view opposing the front surface 10F of the vapor deposition mask 10, each corner 11LC includes a portion farthest from the small opening 11S in the projection 11LP to which that corner 11LC belongs. In the projection 11LP, the corner 11LC has a third angle θ3. The third angle θ3 is formed by the two of the linear portions between which the corner 11LC is located. In detail, the third angle θ3 is formed by a tangent of the projection 11LP in each of the portions where the imaginary edge VE intersects the projections 11LP.

The large opening 11L and the small opening 11S are connected by a side surface 11SD that defines the mask hole 11. The side surface 11SD is inclined such that the area of the mask hole 11 in the cross-section parallel to the front surface 10F of the vapor deposition mask 10 decreases from the large opening 11L toward the small opening 11S. That is, the mask hole 11 has the shape of an inverted frustum in the cross-section that is orthogonal to the front surface 10F of the vapor deposition mask 10. Thus, in the present embodiment, each mask hole 11 is formed by one hole portion having the shape of an inverted frustum.

Figure 3:
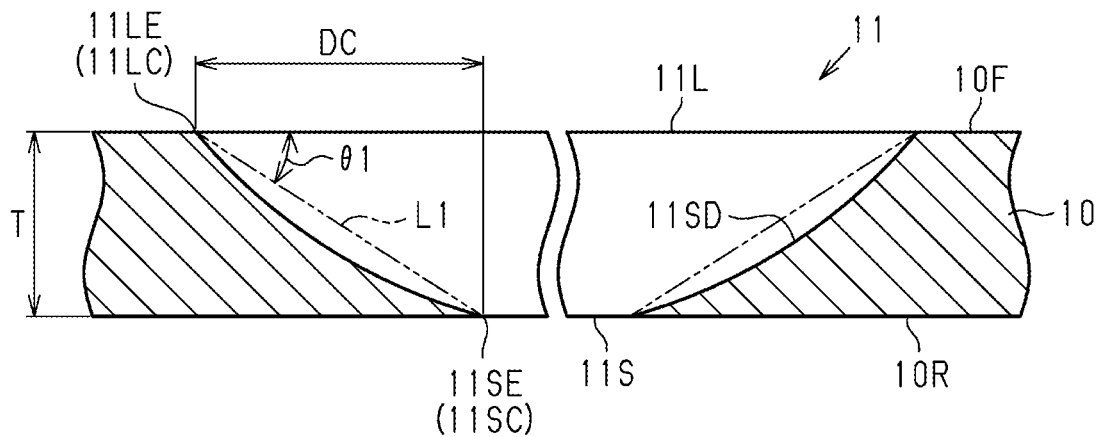
FIG. 3 is a cross-sectional view taken along line III-III in FIG. 2.
Figure 4:
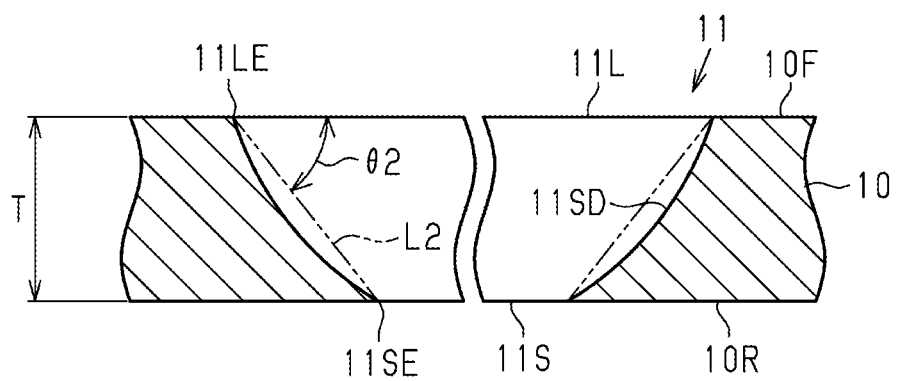
FIG. 4 is a cross-sectional view taken along line IV-IV in FIG. 2.

The shape of the mask hole 11 will now be described in more detail with reference to FIGS. 3 and 4, each showing the cross-sectional structure of the vapor deposition mask 10. FIG. 3 shows the structure of the vapor deposition mask 10 in the cross-section that is taken along line III-III in FIG. 2 and extends in the diagonal direction of the small opening 11S. FIG. 4 shows the structure of the vapor deposition mask 10 in the cross-section that is taken along line IV-IV in FIG. 2 and extends in a direction that is orthogonal to one linear portion 11SL of the edge 11SE of the small opening 11S.

As shown in FIG. 3, in the cross-section that is orthogonal to the front surface 10F of the vapor deposition mask 10 and extends in the diagonal direction of the small opening 11S, a first imaginary straight line L1 connects the corner 11SC of the edge 11SE of the small opening 11S to the corner 11LC of the edge 11LE of the large opening 11L. The first imaginary straight line L1 connects the corner 11SC of the small opening 11S to the corner 11LC of the large opening 11L that corresponds to that corner 11SC of the small opening 11S. That is, the first imaginary straight line L1 connects the corner 11SC of the small opening 11S to the corner 11LC of the large opening 11L closest from the corner 11SC as seen from the view opposing the front surface 10F of the vapor deposition mask 10.

In the example shown in FIG. 3, the side surface 11SD defining the mask hole 11 has an arcuate shape recessed from the first imaginary straight line L1 toward the rear surface 10R. In the cross-section that is orthogonal to the front surface 10F of the vapor deposition mask 10 and extends in the diagonal direction of the small opening 11S, the side surface 11SD defining the mask hole 11 may have an arcuate shape that protrudes from the first imaginary straight line L1 toward the front surface 10F. Alternatively, the side surface 11SD may coincide with the first imaginary straight line L1.

The front surface 10F of the vapor deposition mask 10 and the first imaginary straight line L1 form a first angle θ1. Since the front surface 10F of the vapor deposition mask 10 is substantially parallel to the rear surface 10R of the vapor deposition mask 10, the angle formed by the rear surface 10R and the first imaginary straight line L1 is equal to the first angle θ1.

The inter-corner distance DC is one to one and a half times greater than the distance between the front surface 10F of the vapor deposition mask 10 and a plane including the edge 11SE of the small opening 11S. In the present embodiment, the distance between the front surface 10F of the vapor deposition mask 10 and the plane including the edge 11SE of the small opening 11S is equal to thickness T of the vapor deposition mask 10. As described above, thickness T of the vapor deposition mask 10 may be, for example, between 1 μm and 20 μm inclusive. Thus, the inter-corner distance DC is a value, for example, between 1 μm and 30 μm inclusive.

As shown in FIG. 4, in the cross-section that is orthogonal to the front surface 10F of the vapor deposition mask 10 and extends in the direction that is orthogonal to one linear portion 11SL of the edge 11SE of the small opening 11S, a second imaginary straight line L2 connects the edge 11SE of the small opening 11S to the edge 11LE of the large opening 11L.

In the example shown in FIG. 4, the side surface 11SD defining the mask hole 11 has an arcuate shape recessed from the second imaginary straight line L2 toward the rear surface 10R. In the cross-section that is orthogonal to the front surface 10F of the vapor deposition mask 10 and extends in the direction that is orthogonal to one linear portion 11SL of the edge 11SE of the small opening 11S, the side surface 11SD defining the mask hole 11 may have an arcuate shape that protrudes from the second imaginary straight line L2 toward the front surface 10F. Alternatively, the side surface 11SD may coincide with the second imaginary straight line L2.

The front surface 10F of the vapor deposition mask 10 and the second imaginary straight line L2 form a second angle θ2. Since the front surface 10F of the vapor deposition mask 10 is substantially parallel to the rear surface 10R of the vapor deposition mask 10, the angle formed by the rear surface 10R and the second imaginary straight line L2 is equal to the second angle θ2. The second angle θ2 is greater than the first angle θ1.

Figure 5:
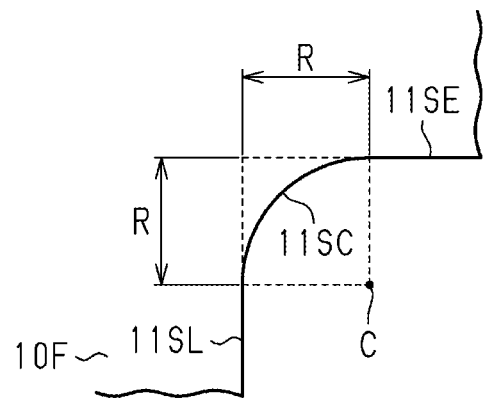
FIG. 5 is an enlarged plan view showing part of the small opening included in the mask hole.

FIG. 5 is an enlarged view showing part of the small opening 11S seen from the view opposing the front surface 10F of the vapor deposition mask 10.

As shown in FIG. 5 and as described above, the corner 11SC of the edge 11SE of the small opening 11S has a curvature. The corner 11SC has a curvature such that a curvature center C is located in the small opening 11S. The corner 11SC has a curvature radius R of less than or equal to 4.5 μm.

Method for Manufacturing Vapor Deposition Mask

The method for manufacturing the vapor deposition mask 10 will now be described with reference to FIGS. 6 to 9.

Figure 6:
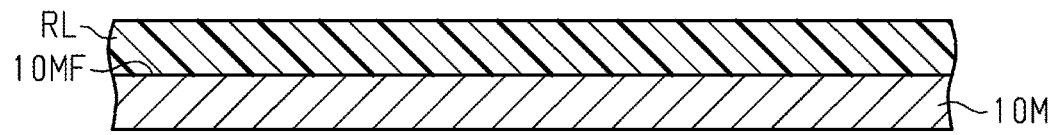
FIG. 6 is a diagram illustrating a step of the method for manufacturing the vapor deposition mask according to the embodiment.
Figure 7:
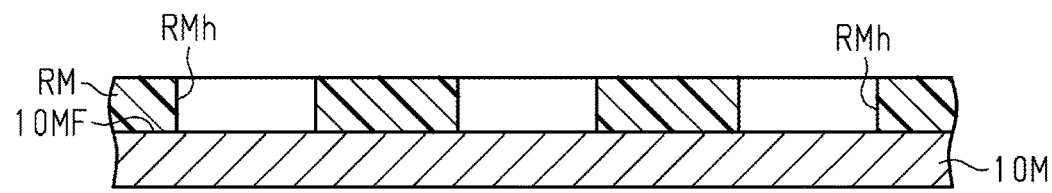
FIG. 7 is a diagram illustrating a step of the method for manufacturing the vapor deposition mask.
Figure 9:
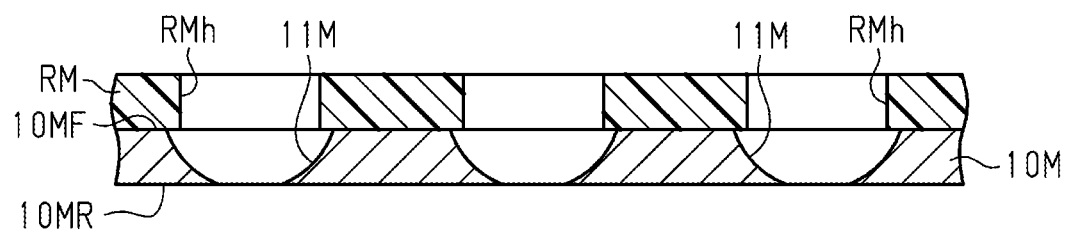
FIG. 9 is a diagram illustrating a step of the method for manufacturing the vapor deposition mask.

The method for manufacturing the vapor deposition mask 10 includes forming a resist mask on at least one of the front surface and the rear surface of the metal sheet and forming mask holes in the metal sheet using the resist mask. The method for manufacturing the vapor deposition mask 10 will now be described in more detail with reference to the drawings. FIGS. 6, 7, and 9 schematically show the mask holes formed in the metal sheet.

Referring to FIG. 6, a metal sheet 10M is first prepared to manufacture the vapor deposition mask 10. The metal sheet 10M is made of, for example, an iron-nickel alloy. The iron-nickel alloy may be, for example, Invar. The thickness of the metal sheet 10M is, for example, between 1 μm and 50 μm inclusive. When the thickness of the metal sheet 10M is greater than thickness T of the vapor deposition mask 10, the thickness of the metal sheet 10M is reduced to the thickness required for the vapor deposition mask 10 by etching the metal sheet 10M before forming a resist layer on the metal sheet 10M.

Next, a resist layer RL is formed on a front surface 10MF of the metal sheet 10M. The resist layer RL may be formed using a positive resist or may be formed by using a negative resist. The resist layer RL may be formed on the front surface of the metal sheet 10M by attaching a dry film resist on the front surface 10MF of the metal sheet 10M. Alternatively, the resist layer RL may be formed by applying, to the front surface 10MF of the metal sheet 10M, coating liquid that contains material used to form the resist layer RL.

As shown in FIG. 7, the resist layer RL is exposed and developed so as to form a resist mask RM from the resist layer RL. The resist mask RM includes mask holes RMh, each shaped in conformance with the shape of the mask hole formed in the metal sheet 10M.

Figure 8:
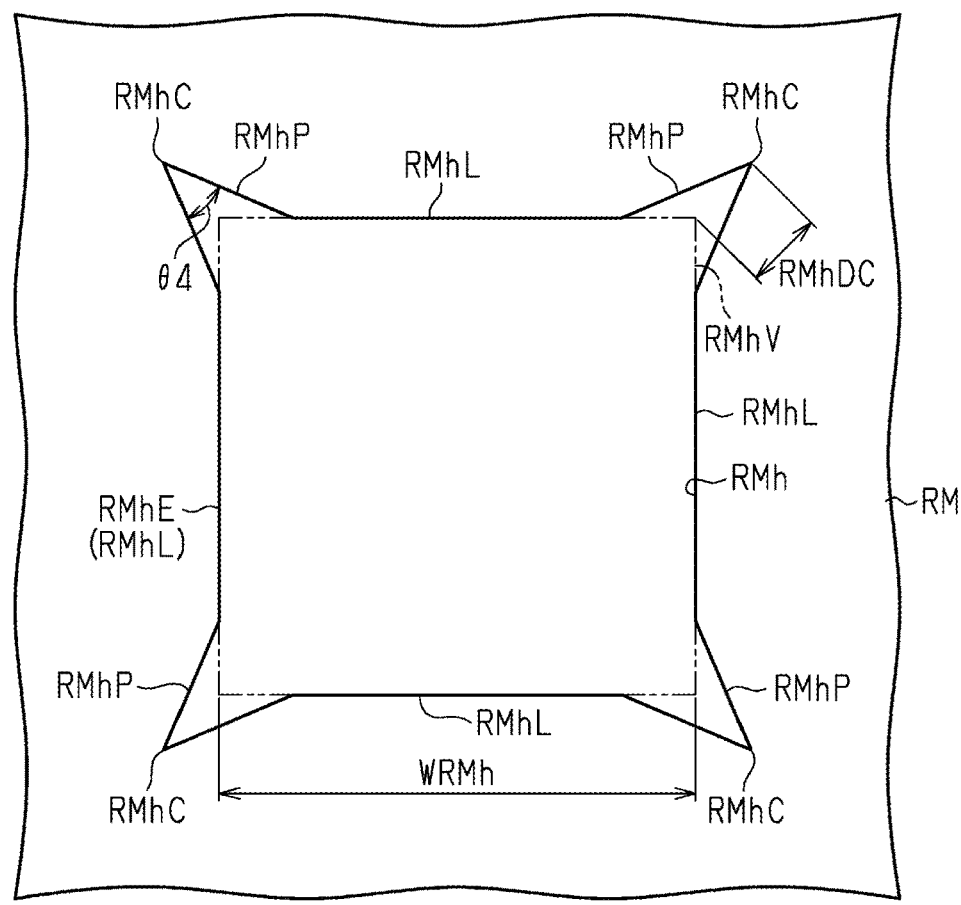
FIG. 8 is a plan view showing the shape of the mask hole included in the resist mask in plan view opposing the front surface of the metal sheet.

FIG. 8 is a plan view showing the resist mask RM as seen from a view opposing the front surface 10MF of the metal sheet 10M. The shape of the mask hole RMh of the resist mask RM shown in FIG. 8 is an example of a shape that the mask hole RMh can have.

As shown in FIG. 8, the mask hole RMh includes an edge RMhE that defines the mask hole RMh. The edge RMhE of the mask hole RMh is shaped such that the corners of a polygonal imaginary edge RMhV project outward from the polygonal shape. In the example shown in FIG. 8, the edge RMhE of the mask hole RMh is shaped such that the corners of a quadrilateral imaginary edge RMhV project outward from the quadrilateral shape. The shape of the edge RMhE of the mask hole RMh is substantially equal to the shape of the edge 11LE of the large opening 11L formed using the resist mask RM. The shape of the imaginary edge RMhV is substantially equal to the shape of the edge 11SE of the small opening 11S.

The edge RMhE of the mask hole RMh includes four projections RMhP and four linear portions RMhL. In the edge RMhE of the mask hole RMh, one projection RMhP is located between two linear portions RMhL. The imaginary edge RMhV includes the four linear portions RMhL. Each projection RMhP includes one corner RMhC. As seen from the view opposing the front surface 10MF of the metal sheet 10M, the region defined by each projection RMhP is substantially triangular. The shape of each projection RMhP is substantially equal to the shape of the projection 11LP of the edge 11LE of the large opening 11L.

In the mask hole RMh, the distance between two of the linear portions RMhL that are substantially parallel to each other is a mask hole width WRMh. The distance between a corner of the imaginary edge RMhV and the corner RMhC of the projection RMhP, which projects from that corner, is a corner correction value RMhDC. In the projection RMhP, the corner RMhC has a fourth angle θ4. The shape of the mask hole formed in the metal sheet 10M is changed by a change in at least one of the mask hole width WRMh, the corner correction value RMhDC, and the fourth angle θ4 in the mask hole RMh.

Referring to FIG. 9, wet etching is performed using the resist mask RM so as to form mask holes 11M in the metal sheet 10M. This forms the mask holes 11M, each including an opening in the front surface 10MF and a rear surface 10MR of the metal sheet 10M. The above-described vapor deposition mask 10 is obtained by removing the resist mask RM from the metal sheet 10M. In the metal sheet 10M, the front surface 10MF corresponds to the front surface 10F of the vapor deposition mask 10, the rear surface 10MR corresponds to the rear surface 10R of the vapor deposition mask 10, and the mask holes 11M correspond to the mask holes 11 of the vapor deposition mask 10.

Mask Device

The mask device will now be described with reference to FIG. 10.

Figure 10:
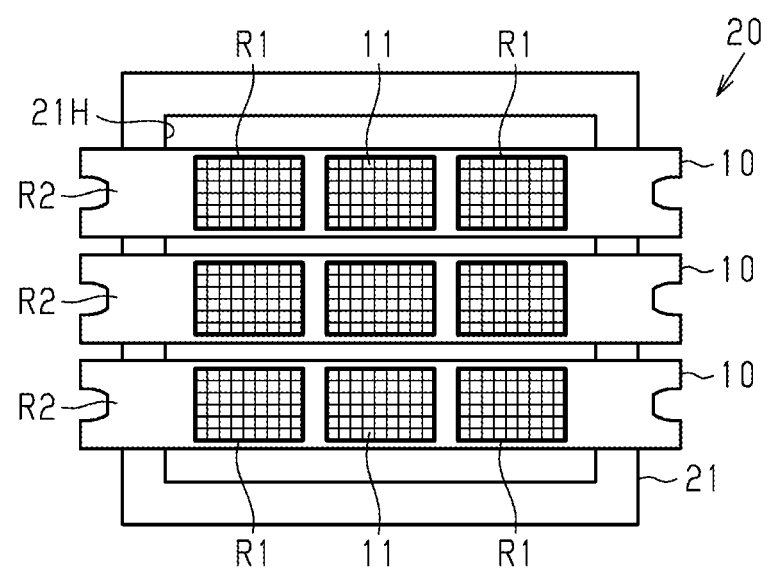
FIG. 10 is a plan view showing the structure of a mask device to which the vapor deposition masks are applied.

As shown in FIG. 10, a mask device 20 includes a frame 21 and vapor deposition masks 10. In the example shown in FIG. 10, the mask device 20 includes three vapor deposition masks 10. Instead, the mask device 20 may include two vapor deposition masks 10 or less, or may include four vapor deposition masks 10 or more. The frame 21 has a rectangular shape that supports the vapor deposition masks 10. The frame 21 is coupled to a vapor deposition apparatus used to perform vapor deposition. The frame 21 includes a frame hole 21H extending through the frame 21 in the substantially entire range where the vapor deposition masks 10 are located.

Each vapor deposition mask 10 has the shape of a belt extending in a single direction. Each vapor deposition mask 10 includes pattern regions R1 and a surrounding region R2 that surrounds the pattern region R1. In the example shown in FIG. 10, each vapor deposition mask 10 includes three pattern regions R1. Instead, each vapor deposition mask 10 may include two pattern regions R1 or less, or may include four pattern regions R1 or more.

In the surrounding region R2 of each vapor deposition mask 10, a pair of portions between which the pattern regions R1 are located in the extending direction of each vapor deposition mask 10 is fixed to the frame 21. Each vapor deposition mask 10 is fixed to the frame 21 through, for example, adhesion or welding.

The method for manufacturing the display device using the vapor deposition mask 10 includes preparing the vapor deposition mask 10 obtained through the above-described method for manufacturing the vapor deposition mask 10 and forming a pattern through vapor deposition using the vapor deposition mask 10.

In the method for manufacturing the display device, the mask device 20 incorporating the vapor deposition mask 10 is first installed in a vacuum chamber of the vapor deposition apparatus. The mask device 20 is installed in the vacuum chamber such that the rear surface 10R opposes a vapor deposition target (such as a glass substrate) and the front surface 10F opposes a vapor deposition source. Then, the vapor deposition target is brought into the vacuum chamber of the vapor deposition apparatus so that the vapor deposition source causes the vapor deposition material to sublime. This causes the pattern shaped in conformance with the small opening 11S to be formed in a region of the vapor deposition target opposing the small opening 11S. In the present embodiment, the vapor deposition material is an organic light-emitting material used to form pixels of an organic electroluminescent display, which is an example of the display device. The vapor deposition material may be a conductive material used to form a pixel electrode included in a pixel circuit of the display device.

EXAMPLES

Examples will now be described with reference to Tables 1 to 3.

Example 1

An Invar metal plate having a thickness of 20 µm was prepared. The metal sheet was etched using 48% ferric chloride so as to reduce the thickness of the metal sheet to 3.5 µm. Next, a positive resist (THMR-iP5700, manufactured by TOKYO OHKA KOGYO CO., LTD.) (THMR is a registered trademark) was used to form a resist layer on the front surface of the metal sheet. The resist layer was exposed and then the exposed resist layer was developed so as to form a resist mask. In this manner, the resist mask was formed with mask holes having the same shape as the mask holes of FIG. 8 as seen from the view opposing the front surface of the resist mask.

In Example 1, as described in the following Table 1, it was found in one mask hole that the mask hole width WRMh was 18.3 µm, the corner correction value RMhDC was 3.3 µm, and the specified value of the fourth angle θ4 was 30.2°. Thus, mask holes are formed such that the target value of the small opening width WS of the vapor deposition mask was 20 µm and the target value of the pitch of each mask hole was 30 µm.

Wet etching was performed using the resist mask so as to form mask holes in the metal sheet. In this step, 48% ferric chloride was used as etchant. In the etching of the metal sheet, when the time for the hole portion formed in the metal sheet to reach the rear surface of the metal sheet was set to 1, the etching time of the metal sheet was set to 2. That is, the etching time was set to a length corresponding to thickness T of the metal sheet for which wet etching was performed. Lastly, the etched metal sheet was immersed for two minutes in 10% aqueous sodium hydroxide solution at 60° C. so as to remove the resist mask from the metal sheet. The vapor deposition mask of Example 1 was thus obtained.

Example 2

In Example 1, the same method as that of Example 1 was used to obtain the vapor deposition mask of Example 2 except that the thickness of the metal sheet was reduced from 20 µm to 4.0 µm, the mask hole width WRMh was 18.0 µm, the corner correction value RMhDC was 3.0 µm, and the fourth angle θ4 was 30.1°.

Example 3

In Example 1, the same method as that of Example 1 was used to obtain the vapor deposition mask of Example 3 except that the thickness of the metal sheet was reduced from 20 µm to 4.5 µm, the mask hole width WRMh was 17.8 µm, the corner correction value RMhDC was 2.8 µm, and the fourth angle θ4 was 30.2°.

Example 4

In Example 2, the same method as that of Example 2 was used to obtain the vapor deposition mask of Example 4 except that the corner correction value RMhDC was 2.0 µm and the fourth angle θ4 was 30.3°.

Example 5

In Example 2, the same method as that of Example 2 was used to obtain the vapor deposition mask of Example 5 except that the corner correction value RMhDC was 2.5 µm and the fourth angle θ4 was 29.9°.

Example 6

In Example 4, the same method as that of Example 4 was used to obtain the vapor deposition mask of Example 6 except that the corner correction value RMhDC was 1.5 µm and the fourth angle θ4 was 29.8°.

Example 7

In Example 1, the same method as that of Example 1 was used to obtain the vapor deposition mask of Example 7 except that the corner correction value RMhDC was 4.3 µm and the fourth angle θ4 was 30.0°.

Comparative Example 1

In Example 1, the same method as that of Example 1 was used to obtain the vapor deposition mask of Comparative Example 1 except that the corner correction value RMhDC was 0.8 µm and the fourth angle θ4 was 29.9°.

TABLE 1

|  | Mask Hole Width WRMh (µm) | Corner Correction Value RMhDC (µm) | Fourth Angle θ4 (°) |
|---|---|---|---|
| Example 1 | 18.3 | 3.3 | 30.2 |
| Example 2 | 18.0 | 3.0 | 30.1 |
| Example 3 | 17.8 | 2.8 | 30.2 |
| Example 4 | 18.0 | 2.0 | 30.3 |
| Example 5 | 18.0 | 2.5 | 29.9 |
| Example 6 | 18.0 | 1.5 | 29.8 |
| Example 7 | 18.3 | 4.3 | 30.0 |
| Comparative Example 1 | 18.3 | 0.8 | 29.9 |

Measurement Results

For the vapor deposition masks of Examples 1 to 7 and Comparative Example 1, various dimensions and the like were measured using a confocal laser microscope (OLS-4000, manufactured by OLYMPUS CORPORATION). The measurement results of the vapor deposition masks were as follows.

TABLE 2

|  | Small Opening Width WS (µm) | First Angle θ1 (°) | Second Angle θ2 (°) | Thickness T (µm) | Inter-Corner Distance DC (µm) | DC/T | Curvature Radius R (µm) | Third Angle θ3 (°) |
|---|---|---|---|---|---|---|---|---|
| Example 1 | 20.4 | 30.2 | 45.1 | 3.5 | 4.9 | 1.4 | 3.0 | 51.6 |
| Example 2 | 20.3 | 31.1 | 44.8 | 4.0 | 4.9 | 1.2 | 3.2 | 51.5 |
| Example 3 | 19.9 | 30.5 | 44.7 | 4.5 | 5.1 | 1.1 | 3.9 | 51.6 |
| Example 4 | 20.4 | 31.0 | 45.2 | 4.0 | 4.0 | 1.0 | 4.4 | 51.8 |
| Example 5 | 20.1 | 30.1 | 45.3 | 4.0 | 4.6 | 1.2 | 3.8 | 51.1 |
| Example 6 | 20.1 | 45.0 | 44.9 | 4.0 | 3.3 | 0.8 | 7.2 | 51.0 |
| Example 7 | 20.4 | 29.9 | 44.7 | 3.5 | 6.2 | 1.8 | — | 51.3 |
| Comparative Example 1 | 19.8 | 45.2 | 45.0 | 3.5 | 2.6 | 0.7 | 8.5 | 51.1 |

As shown in Table 2, in the vapor deposition mask of Example 1, it was found through the transparent image captured in a direction opposing the rear surface that small openings, each having a width of approximately 20 µm and having a substantially square shape, were laid out at intervals of approximately 10 µm in a square lattice pattern. The distance between two linear portions parallel to each other was measured as the width of each small opening. Likewise, in the vapor deposition masks of Examples 2 to 6 and the vapor deposition mask of Comparative Example 1, it was found that small openings, each having a width of approximately 20 µm and having a substantially square shape, were laid out at intervals of approximately 10 µm in a square lattice pattern. In contrast, it was found that the vapor deposition mask of Example 7 had a quadrilateral shape in which the edge of each small opening was narrowed in the left-right direction and the up-down direction as a result of excessive etching of the corners while the opening of each small opening had a width of approximately 20 µm.

Further, it was found in Examples 1 to 7 that the edge of the large opening had a shape in which the corners of the quadrilateral shape projected outward from the square shape. In contrast, it was found in Comparative Example 1 that the edge of the large opening had a substantially square shape and the corners in the square shape did not project outward from the square shape.

It was found that the first angle θ1 was 30.2° in Example 1, 31.1° in Example 2, and 30.5° in Example 3. Further, it was found that the first angle θ1 was 31.0° in Example 4 and 30.1° in Example 5. Furthermore, it was found that the first angle θ1 was 45.0° in Example 6, 29.9° in Example 7, and 45.2° in Comparative Example 1.

It was found that the second angle θ2 was 45.1° in Example 1, 44.8° in Example 2, and 44.7° in Example 3. Further, it was found that the second angle θ2 was 45.2° in Example 4 and 45.3° in Example 5. Furthermore, it was found that the second angle θ2 was 44.9° in Example 6, 44.7° in Example 7, and 45.0° in Comparative Example 1.

Thus, it was found that the second angle θ2 was larger than the first angle θ1 in the vapor deposition masks of Examples 1 to 5 and 7. In contrast, it was found that the first angle θ1 was larger than the second angle θ2 in the vapor deposition masks of Example 6 and Comparative Example 1.

It was found that the inter-corner distance DC was 4.9 µm in Examples 1 and 2, 5.1 µm in Example 3, 4.0 µm in Example 4, and 4.6 µm in Example 5. Further, it was found that the inter-corner distance DC was 3.3 µm in Example 6, 6.2 µm in Example 7, and 2.6 µm in Comparative Example 1.

In other words, it was found that the ratio of the inter-corner distance DC to thickness T (DC/T) of the vapor deposition mask was 1.4 in the Example 1, 1.2 in Example 2, and 1.1 in Example 3. Further, it was found that the ratio of the inter-corner distance DC to thickness T of the vapor deposition mask was 1.0 in the Example 4 and 1.2 in Example 5. Furthermore, it was found that the ratio of the inter-corner distance DC to thickness T of the vapor deposition mask was 0.8 in the Example 6, 1.8 in Example 7, and 0.7 in Comparative Example 1. Thus, it was found that the ratio of the inter-corner distance DC to thickness T of the vapor deposition mask is included in a range between 1 and 1.5 inclusive in the vapor deposition masks of Examples 1 to 5 while the ratio of the inter-corner distance DC to thickness T of the vapor deposition mask is not included in the range between 1 and 1.5 inclusive in the vapor deposition masks of Examples 6, 7, and Comparative Example 1.

It was found that the curvature radius R of each corner included in the edge of the small opening was 3.0 µm in Example 1, 3.2 µm in Example 2, and 3.9 µm in Example 3. Further, it was found that the curvature radius R was 4.4 µm in Example 4, 3.8 µm in Example 5, and 7.2 µm in Example 6. Furthermore, it was found that the curvature radius R was 8.5 µm in Comparative Example 1. Thus, it was found that the curvature radius R was less than or equal to 4.5 µm in the vapor deposition masks of Examples 1 to 5 while the curvature radius R was greater than 4.5 µm in the vapor deposition mask of Example 6 and Comparative Example 1. Regarding Example 7, it was found that the edge of the small opening was narrowed in the left-right direction and the up-down direction and thus the corner had no curvature.

It was found that the third angle θ3 was 51.6° in Example 1, 51.5° in Example 2, and 51.6° in Example 3. It was found that the third angle θ3 was 51.8° in Example 4, 51.1° in Example 5, and 51.0° in Example 6. It was found that the third angle θ3 was 51.3° in Example 7 and 51.1° in Comparative Example 1. In Comparative Example 1, the third angle θ3 was set to an angle at the corner included in the large opening.

Evaluation Results

The vapor deposition pattern was formed on the vapor deposition target using each of the vapor deposition mask of Examples 1 to 7 and Comparative Example 1. A glass substrate was used for the vapor deposition target. An organic light-emitting material was used for the vapor deposition material used to form the vapor deposition pattern.

Each vapor deposition mask was used to form a quadrilateral vapor deposition pattern laid out in a grid pattern of fifteen rows and fifteen columns. In the middle of this vapor deposition pattern, variations in the thickness were calculated for the vapor deposition pattern of nine rows and nine columns. The thickness in the middle of each vapor deposition pattern was measured, and that thickness was regarded as a maximum value MM in the thickness of the vapor deposition pattern. Further, the thickness at the corner of each vapor deposition pattern was measured, and that thickness was regarded as a minimum value Mm in the thickness of the vapor deposition pattern. The thickness of each vapor deposition pattern was measured using a profilometer (Dektak 6M, manufactured by Veeco, Inc.). The following Equation (1) was used to calculate the variation in the thickness. The variation of less than or equal to 5% was marked with "○". The variation of less than or equal to 10% was marked with "Δ". The variation of greater than 10% was marked with "×".

$$100\times\{(MM-Mm)/(MM+Mm)\}/2\ (\%) \quad \text{Equation (1)}$$

Table 3 shows the variations in the thickness that were calculated using Equation (1).

TABLE 3

|  | Thickness Variation (%) | Evaluation |
| --- | --- | --- |
| Example 1 | 4.1 | ○ |
| Example 2 | 4.3 | ○ |
| Example 3 | 4.9 | ○ |
| Example 4 | 5.0 | ○ |
| Example 5 | 4.7 | ○ |
| Example 6 | 9.2 | Δ |
| Example 7 | 4.0 | ○ |
| Comparative Example 1 | 10.3 | × |

As shown in Table 3, it was found that the results of evaluating the vapor deposition masks of Examples 1 to 5 and 7 were "○", the result of evaluating the vapor deposition mask of Example 6 was "Δ", and the result of evaluating the vapor deposition mask of Comparative Example 1 was "×". Accordingly, it was found that the vapor deposition masks of Examples 1 to 7 limited variations in the thickness of the vapor deposition pattern as compared with Comparative Example 1.

Further, it was found that variations in the thickness of the vapor deposition pattern tended to be larger when the ratio of the inter-corner distance DC to thickness T was less than 1 than when the ratio of the inter-corner distance DC to thickness T was greater than or equal to 1. When the ratio of the inter-corner distance DC to thickness T was greater than 1.5, it was found that variations in the thickness of the vapor deposition pattern were small while the edge of the vapor deposition pattern was narrowed relative to a desired polygonal shape. Thus, it is preferred that the ratio of the inter-corner distance DC to thickness T be between 1 and 1.5 inclusive in order to limit variations in the thickness of the vapor deposition pattern and increase the accuracy of the shape in the vapor deposition pattern.

Additionally, it was found that variations in the thickness of the vapor deposition pattern tended to be larger when the curvature radius R was greater than 4.5 μm than when the curvature radius R was less than or equal to 4.5 μm. Thus, it is preferred that the curvature radius R be less than or equal to 4.5 μm in order to limit variations in the thickness of the vapor deposition pattern.

As described above, the vapor deposition mask, the method for manufacturing the vapor deposition mask, and the method for manufacturing the display device according to the embodiment provide the following advantages.

(1) The vapor deposition material entering the mask hole 11 from the vicinity of each corner 11LC of the large opening 11L easily reaches the small opening 11S. This limits variations in the thickness of the vapor deposition pattern.

(2) In the vapor deposition pattern, the thickness of each corner is prevented from being smaller than the thickness of the middle portion. This limits variations in the thickness of the vapor deposition pattern.

(3) The distance between the small opening 11S and the vapor deposition target is reduced as compared with a configuration in which the small opening 11S shaped in conformance with the vapor deposition pattern formed on the vapor deposition target is located between the front surface 10F and the rear surface 10R. This limits variations in the thickness in the vapor deposition pattern formed on the vapor deposition target.

(4) As compared with a configuration in which the thickness of the vapor deposition mask 10 is greater than 20 μm, the large opening 11L capable of extending through the metal sheet 10M is reduced in size. This allows the vapor deposition mask 10 to include the mask holes 11 with a higher density.

(5) The difference between the degree of expansion of the vapor deposition mask 10 and the degree of expansion of the glass substrate is prevented from being excessively increased by the heating of the vapor deposition mask 10 and the glass substrate. This prevents the accuracy of the vapor deposition pattern formed on the glass substrate from being decreased by the difference between the expansion rate of the vapor deposition mask 10 and the expansion rate of the glass substrate.

The above-described embodiment may be modified as follows.

Large Opening

The shape of each projection 11LP included in the edge 11LE of the large opening 11L may be changed as follows. That is, as shown in the drawings referenced later, the region defined by the projection 11LP can have various shapes seen from the view opposing the front surface 10F of the vapor deposition mask 10.

Figure 11:
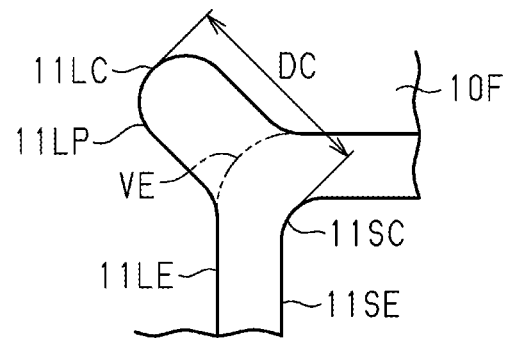
FIG. 11 is a plan view showing part of a first modification in the shape of the mask hole seen from the view opposing the front surface of the vapor deposition mask.
Figure 12:
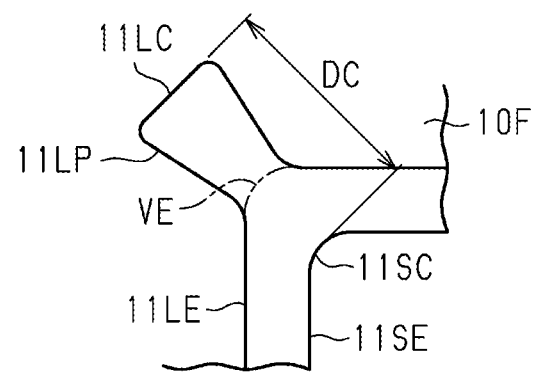
FIG. 12 is a plan view showing part of a second modification in the shape of the mask hole seen from the view opposing the front surface of the vapor deposition mask.
Figure 13:
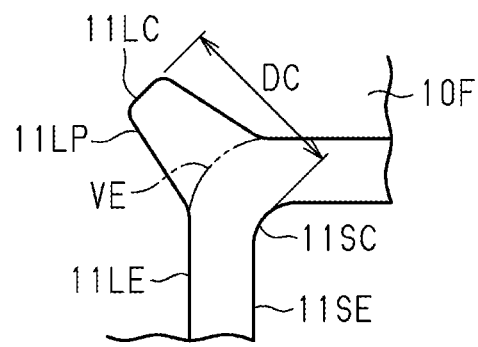
FIG. 13 is a plan view showing part of a third modification in the shape of the mask hole seen from the view opposing the front surface of the vapor deposition mask.
Figure 14:
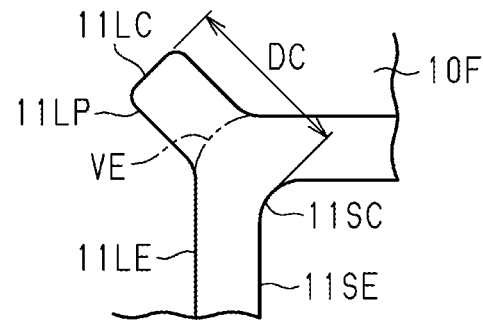
FIG. 14 is a plan view showing part of a fourth modification in the shape of the mask hole seen from the view opposing the front surface of the vapor deposition mask.
Figure 15:
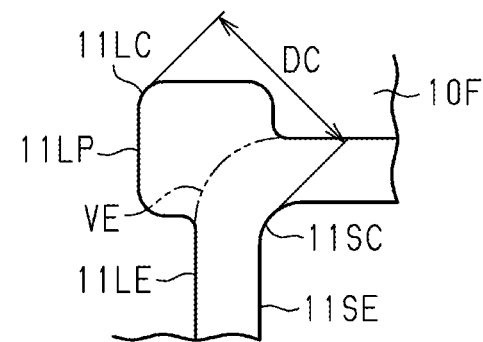
FIG. 15 is a plan view showing part of a fifth modification in the shape of the mask hole seen from the view opposing the front surface of the vapor deposition mask.
Figure 16:
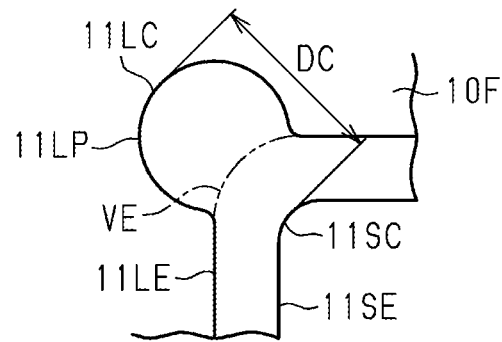
FIG. 16 is a plan view showing part of a sixth modification in the shape of the mask hole seen from the view opposing the front surface of the vapor deposition mask.

For example, the region defined by the projection 11LP may have a substantially rectangular shape as shown in FIG. 11 or may have an inverted-trapezoid shape as shown in FIG. 12. Instead, the region defined by the projection 11LP may have a substantially trapezoid shape as shown in FIG. 13 or may have a substantially rectangular shape with a linear corner 11LC as shown in FIG. 14. As another option, as shown in FIG. 15, the region defined by the projection 11LP may have a substantially square shape and the projection 11LP may include three corners located outward from the imaginary edge VE. Alternatively, as shown in FIG. 16, the region defined by the projection 11LP may have a substantially circular shape.

In any of these shapes of the region defined by the projection 11LP, the edge 11LE of the large opening 11L has a shape in which the corners of the polygonal shape of the edge 11SE of the small opening 11S project outward from the polygonal shape. This provides an advantage similar to the above-described advantage (1).

Further, in any of these shapes of the region defined by the projection 11LP, the inter-corner distance DC is one to one and a half greater than thickness T of the vapor deposition mask 10. This allows the side surface 11SD, which defines the mask hole 11, to have a reduced inclination angle at a portion connecting each corner 11SC of the edge 11SE of the small opening 11S to the corresponding corner 11LC of the edge 11LE of the large opening 11L.

Number of Corners

The edge 11SE of the small opening 11S may have a polygonal shape other than a quadrilateral shape. The small opening 11S may have a polygonal shape including, for example, five or more corners 11SC. The edge 11LE of the large opening 11L may have, for example, five or more corners 11LC.

Figure 17:
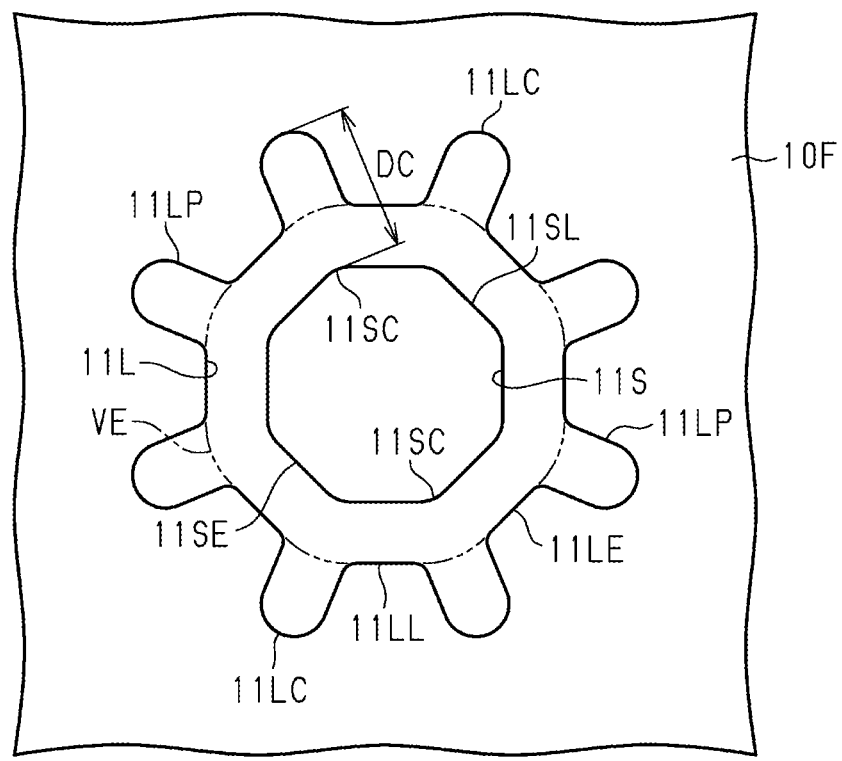
FIG. 17 is a plan view showing part of a seventh modification in the shape of the mask hole seen from the view opposing the front surface of the vapor deposition mask.

FIG. 17 shows a modification in the shape of the edge 11SE of the small opening 11S.

As shown in FIG. 17, the edge 11SE of the small opening 11S has a substantially octagonal shape. The edge 11SE of the small opening 11S includes eight linear portions 11SL and eight corners 11SC. In the same manner as the above-described embodiment, the curvature radius R of each curvature radius R is less than or equal to 4.5p.m.

The edge 11LE of the large opening 11L includes eight linear portions 11LL and eight projections 11LP. Each corner 11LC belongs to a different one of the projections 11LP. In the same manner as the modification shown in FIG. 11, the region defined by each projection 11LP has a substantially rectangular shape and the corresponding corner 11LC has a curvature. To these projections 11LP, the projections 11LP described above with reference to FIGS. 2 and 12 to 16 are applicable.

When the edge 11SE of the small opening 11S has a polygonal shape other than a quadrilateral shape, the first imaginary straight line L1 can be defined in the cross-section that is orthogonal to the front surface 10F of the vapor deposition mask 10 and extends along a plane including one corner 11SC of the small opening 11S and the corner 11LC of the large opening 11L corresponding to that corner 11SC. Further, when the edge 11SE of the small opening 11S has a polygonal shape other than a quadrilateral shape, the second imaginary straight line L2 can be defined in the cross-section that is orthogonal to the front surface 10F of the vapor deposition mask 10 and extends along a plane including one linear portion 11SL of the small opening 11S and the linear portion 11LL of the large opening 11L parallel to that linear portion 11SL.

Mask Hole

The mask hole may include two hole portions.

Figure 18:
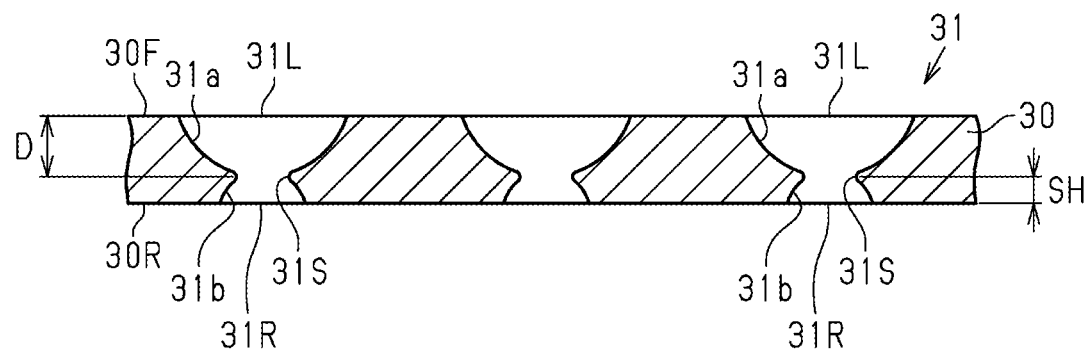
FIG. 18 is a cross-sectional view showing an eighth modification in the shape of the mask hole included in the vapor deposition mask.

More specifically, as shown in FIG. 18, each mask hole 31 in a vapor deposition mask 30 may include a large-hole portion 31a (one hole portion) and a small-hole portion 31b (the other hole portion). The large-hole portion 31a is connected to the small-hole portion 31b at a point in the thickness direction of the vapor deposition mask 30. The large-hole portion 31a includes a large opening 31L on a front surface 30F and a small opening 31S on a side opposite from the large opening 31L. The small-hole portion 31b shares the small opening 31S with the large-hole portion 31a and includes a rear surface opening 31R.

The rear surface opening 31R is located on a side opposite from the small opening 31S and opens in a rear surface 30R. The distance from the rear surface 30R to the portion that connects the large-hole portion 31a to the small-hole portion 31b is a step height SH. It is preferred that the step height SH be small in order to limit the unevenness in luminance arising from a shadow effect on the vapor deposition pattern. The configuration in which the mask hole 31 includes two hole portions increases the thickness of the vapor deposition mask 30 while limiting a decrease in the resolution in the vapor deposition mask 30.

In the same manner as the above-described embodiment, distance D between the front surface 30F of the vapor deposition mask 30 and the plane including the edge of the small opening 31S can be sized such that the inter-corner distance DC is one to one and a half times greater than the distance D.

Even in this case, the large opening 31L of the vapor deposition mask 30 has a shape in which the corners of the polygonal shape of the edge of the small opening 31S project outward from the polygonal shape. This provides an advantage similar to the above-described advantage (1).

Each mask hole 11 included in the vapor deposition mask 10 does not need to satisfy at least one of the following conditions.

(Condition A) The second angle θ2 is greater than the first angle θ1.

(Condition B) The inter-corner distance DC is one to one and a half times greater than the distance between the front surface of the vapor deposition mask 10 and the plane including the edge 11SE of the small opening 11S.

(Condition C) The curvature radius R of the corner 11SC at the edge 11SE of the small opening 11S is less than or equal to 4.5 μm.

Even if the mask hole 11 does not satisfy at least one of the conditions A to C, the edge 11LE of the large opening 11L has a shape in which the corners of the polygonal shape of the edge 11SE of the small opening 11S project outward from the polygonal shape. This provides an advantage similar to the above-described advantage (1).

Material for Vapor Deposition Mask

The vapor deposition mask 10 may be made of metal other than an iron-nickel alloy. The vapor deposition mask 10 may be made of, for example, an iron-nickel-cobalt alloy such as an alloy containing nickel of 32 mass % and cobalt of between 4 mass % and 5 mass % inclusive (namely, Super Invar). The vapor deposition mask 10 may be made of an iron-chrome-nickel alloy (namely, chrome-nickel stainless steel). The chrome-nickel stainless steel may be, for example, SUS304. An iron-chrome-nickel alloy has a larger thermal expansion coefficient than an iron-nickel alloy and an iron-nickel-cobalt alloy. Thus, an iron-chrome-nickel alloy may be used when the temperature of the vapor deposition mask 10 increases to a small extent during vapor deposition, and it is preferred that an iron-nickel alloy or an iron-nickel-cobalt alloy be used when the temperature of the vapor deposition mask 10 increases to a large extent.

Even in this case, the edge 11LE of the large opening 11L has a shape in which the corners of the polygonal shape of the edge 11SE of the small opening 11S project outward from the polygonal shape. This provides an advantage similar to the above-described advantage (1).

Thickness of Vapor Deposition Mask

The thickness of the vapor deposition mask may be greater than 20 μm. Even in this case, the edge 11LE of the large opening 11L has a shape in which the corners of the polygonal shape of the edge 11SE of the small opening 11S project outward from the polygonal shape. This provides an advantage similar to the above-described advantage (1).

Vapor Deposition Mask

The vapor deposition mask 10 may include mask portions corresponding to the pattern region R1 and a sub-frame corresponding to the surrounding region R2. In this case, the sub-frame is separate from the mask portions and includes sub-frame holes. Each mask portion is coupled to the sub-frame so as to close a different one of the sub-frame holes. As a result, the number of the mask portions is the same as the number of the sub-frame holes in the vapor deposition mask 10. The mask portions may be coupled to the sub-frame through adhesion or welding.

In this case, the sub-frame supports the mask portions. Thus, as compared with a configuration in which the mask portions are integrated with the surrounding portion, the thickness of each mask portion is reduced. To form each mask portion, the thickness of the mask portion is reduced by etching two opposite surfaces of the mask portion prior to forming mask holes in the mask portion. To form a thin mask portion, the mask portion may be stacked on a support layer that supports the mask portion in the etching for reducing the thickness of the mask portion and the etching for forming the mask holes in the mask portion in order to improve the handleability of the mask portion. The support layer simply needs to be removed from the mask portion after coupling the mask portion to the frame.

What is claimed is:

1. A vapor deposition mask made of metal, the vapor deposition mask comprising:
   a front surface configured to oppose a vapor deposition source; and
   mask holes each including a hole portion having a shape of an inverted frustum, wherein the hole portion of each of the mask holes includes:
   a first opening including a polygonal first edge as seen from a view opposing the front surface of the vapor deposition mask, the first edge including first corners and first linear portions each located between adjacent ones of the first corners; and
   a second opening, larger in size than the first opening, located on the front surface, the second opening including a second edge as seen from the view opposing the front surface of the vapor deposition mask, the second edge including second corners and second liner portions, wherein each of the second corners is defined by a projection that projects out from an imaginary corner where two imaginary lines extending along the second linear portions, between which the respective second corner is located, would intersect, the second edge being shaped such that the second corners of the second edge of the second opening project outward from the first edge of the first opening, and
   the second opening surrounds the first opening as seen from the view opposing the front surface.

2. The vapor deposition mask according to claim 1, wherein
   the vapor deposition mask further includes a rear surface on a side opposite from the front surface,
   the first opening is located on the rear surface.

3. The vapor deposition mask according to claim 1, wherein the vapor deposition mask includes a thickness of between 1 μm and 20 μm inclusive.

4. The vapor deposition mask according to claim 1, wherein the vapor deposition mask is made of an iron-nickel alloy or an iron-nickel-cobalt alloy.

5. A method for manufacturing a vapor deposition mask according to claim 1, the method comprising:
   forming a resist mask on at least one of a front surface or a rear surface of a metal sheet; and
   forming mask holes in the metal sheet using the resist mask, wherein the forming the mask holes forms the mask holes, each including a hole portion having a shape of an inverted frustum, in the metal sheet such that
   the hole portion of each of the mask holes includes:
   a first opening including a polygonal first edge as seen from a view opposing a plane on which the metal sheet spreads, the first edge including first corners and first linear portions each located between adjacent ones of the first corners; and
   a second opening, larger in size than the first opening, located on the front surface, the second opening including a second edge as seen from the view opposing the front surface of the vapor deposition mask, the second edge including second corners and second liner portions each located between adjacent one of the second corners, the second edge being shaped such that the second corners of the second edge of the second opening project outward from the first edge of the first opening, and
   the second opening surrounds the first opening as seen from the view opposing the front surface.

6. The method according to claim 5, wherein
   in a cross-section that is orthogonal to the front surface and extends in a diagonal direction of the first opening, a first imaginary straight line connects each of the first corners of the first opening to a corresponding one of the second corners of the second opening and the front surface and the first imaginary straight line form a first angle,
   in a cross-section that is orthogonal to the front surface and extends in a direction that is orthogonal to one of the first linear portions of the first opening, a second imaginary straight line connects the first edge of the first opening to the second edge of the second opening and the front surface and the second imaginary straight line form a second angle,
   the forming the mask holes forms the mask holes in the metal sheet such that
   the second angle is greater than the first angle,
   a distance between each of the first corners of the first opening to a corresponding one of the second corners of the second opening is one to one and a half times greater than a distance between the front surface and a plane including the first edge of the first opening as seen from the view opposing the front surface, and
   the corners of the first opening have a curvature radius of less than or equal to 4.5 μm.

7. A vapor deposition mask made of metal, the vapor deposition mask comprising:
   a front surface configured to oppose a vapor deposition source; and
   mask holes each including a hole portion having a shape of an inverted frustum, wherein
   the hole portion of each of the mask holes includes:
   a first opening including a polygonal first edge as seen from a view opposing the front surface of the vapor deposition mask, the first edge including first corners and first linear portions each located between adjacent ones of the first corners; and
   a second opening, larger in size than the first opening, located on the front surface, the second opening including a second edge as seen from the view opposing the front surface of the vapor deposition mask, the second edge being shaped such that second corners of the second edge of the second opening project outward from the first edge of the first opening, and
   the second opening surrounds the first opening as seen from the view opposing the front surface, wherein
   in a cross-section that is orthogonal to the front surface and extends in a diagonal direction of the first opening, a first imaginary straight line connects each of the first corners of the first opening to a corresponding one of the second corners of the second opening and the front surface and the first imaginary straight line form a first angle, in a cross-section that is orthogonal to the front surface and extends in a direction that is orthogonal to one of the first linear portions of the first opening, a second imaginary straight line connects the first edge of the first opening to the second edge of the second opening and the front surface and the second imaginary straight line form a second angle, the second angle is greater than the first angle, a distance between each of the first corners of the first opening to a corresponding one of the second corners of the second opening is one to one and a half times greater than a distance between the front surface and a plane including the first edge of the first opening as seen from the view opposing the front surface, and the corners of the first opening have a curvature radius of less than or equal to 4.5 μm.

8. The vapor deposition mask according to claim 7, wherein the vapor deposition mask further includes a rear surface on a side opposite from the front surface, the first opening is located on the rear surface.

9. The vapor deposition mask according to claim 7, wherein the vapor deposition mask includes a thickness of between 1 μm and 20 μm inclusive.

10. The vapor deposition mask according to claim 7, wherein the vapor deposition mask is made of an iron-nickel alloy or an iron-nickel-cobalt alloy.

\* \* \* \* \*